US012668873B2

(12) United States Patent
Dhawade et al.

(10) Patent No.: US 12,668,873 B2
(45) Date of Patent: Jun. 30, 2026

(54) GAS SUPPLY LINE ARRANGEMENTS

(71) Applicant: Lam Research Corporation, Fremont, CA (US)

(72) Inventors: Eashan Raju Dhawade, Nagpur (IN); Michael Rumer, Santa Clara, CA (US); Ravi Vellanki, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/862,142

(22) PCT Filed: Apr. 28, 2023

(86) PCT No.: PCT/US2023/020450
§ 371 (c)(1),
(2) Date: Oct. 31, 2024

(87) PCT Pub. No.: WO2023/215199
PCT Pub. Date: Nov. 9, 2023

(65) Prior Publication Data
US 2025/0297362 A1 Sep. 25, 2025

Related U.S. Application Data

(60) Provisional application No. 63/337,508, filed on May 2, 2022.

(51) Int. Cl.
*C23C 16/44* (2006.01)
*H01J 37/32* (2006.01)

(52) U.S. Cl.
CPC ...... *C23C 16/4405* (2013.01); *C23C 16/4408* (2013.01); *H01J 37/32449* (2013.01); *H01J 37/32862* (2013.01)

(58) Field of Classification Search
None
See application file for complete search history.

(56) References Cited

U.S. PATENT DOCUMENTS

| | | |
|---|---|---|
| 2004/0031440 A1 | 2/2004 | Chen et al. |
| 2007/0207625 A1 | 9/2007 | Aggarwal et al. |

(Continued)

FOREIGN PATENT DOCUMENTS

| | | |
|---|---|---|
| CN | 119137722 | 12/2024 |
| KR | 20120131400 A | 12/2012 |
| WO | WO-2023215199 A1 | 11/2023 |

OTHER PUBLICATIONS

International Application Serial No. PCT/US2023/020450, International Search Report mailed Aug. 17, 2023, 3 pgs.

(Continued)

*Primary Examiner* — Eric W Golightly
(74) *Attorney, Agent, or Firm* — Schwegman Lundberg & Woessner, P.A.

(57) ABSTRACT

In some examples, a gas supply line arrangement is provided for inhibiting particle contamination in a substrate process chamber. An example gas supply line arrangement comprises a cleaning gas source for a clean cycle of the substrate process chamber, a purge gas source for a purge cycle of the substrate process chamber, and a gas supply line to carry cleaning gas and purge gas towards the substrate process chamber. A three-port valve in the gas supply line arrangement comprises a valve inlet connected to the gas supply line, a first valve outlet in fluid communication with the substrate process chamber, the first valve outlet operable to admit or prevent a passage of cleaning gas to the substrate process chamber, and a second valve outlet connected to a divert line and operable to admit or prevent a passage of particle-containing purge gas to the divert line.

15 Claims, 7 Drawing Sheets

(56) References Cited

U.S. PATENT DOCUMENTS

| 2013/0019960 A1 | 1/2013 | Choi et al. | |
| 2016/0147234 A1 | 5/2016 | Leeser et al. | |
| 2021/0134564 A1* | 5/2021 | Sawachi | .......... H01J 37/32449 |

OTHER PUBLICATIONS

International Application Serial No. PCT/US2023/020450, Written Opinion mailed Aug. 17, 2023, 4 pgs.
"International Application Serial No. PCT US2023 020450, International Preliminary Report on Patentability mailed Nov. 14, 2024", 6 pgs.

* cited by examiner

AR FLOW

202 — TWO PORT VALVE

TO CHAMBER

AR FLOW

PURGE PATH — 314

308

DEAD ZONE, PARTICLES TRAPPED

306

310

302

TO DIVERT LINE

312

CLOSED

202

TO CHAMBER

AR FLOW
FROM CLEANING GAS SOURCE(S) 122,
INCLUDING CLEAN GAS SOURCE
AND PURGE GAS SOURCE

PURGE PATH

Ar + AlFx PARTICLES PURGED 402
306
312

404

TO DIVERT LINE

TO CHAMBER

FROM REMOTE PLASMA SOURCE
FROM CLEANING GAS SOURCE(S) 122,
INCLUDING CLEAN GAS SOURCE
AND PURGE GAS SOURCE

402

TO
CHAMBER

504

502

510

506

508

TO
DIVERT

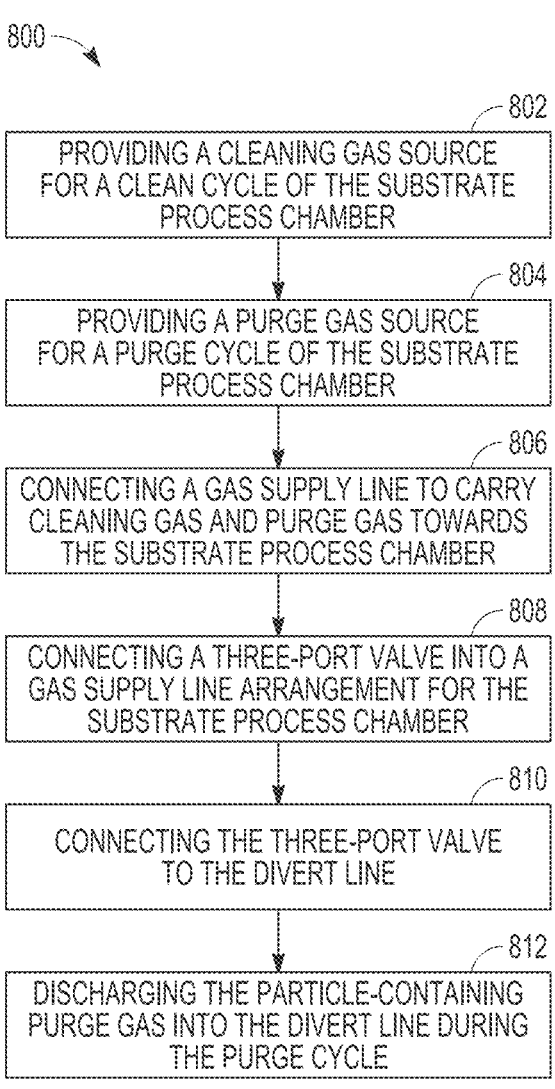

800

802
PROVIDING A CLEANING GAS SOURCE
FOR A CLEAN CYCLE OF THE SUBSTRATE
PROCESS CHAMBER

804
PROVIDING A PURGE GAS SOURCE
FOR A PURGE CYCLE OF THE SUBSTRATE
PROCESS CHAMBER

806
CONNECTING A GAS SUPPLY LINE TO CARRY
CLEANING GAS AND PURGE GAS TOWARDS
THE SUBSTRATE PROCESS CHAMBER

808
CONNECTING A THREE-PORT VALVE INTO A
GAS SUPPLY LINE ARRANGEMENT FOR THE
SUBSTRATE PROCESS CHAMBER

810
CONNECTING THE THREE-PORT VALVE
TO THE DIVERT LINE

812
DISCHARGING THE PARTICLE-CONTAINING
PURGE GAS INTO THE DIVERT LINE DURING
THE PURGE CYCLE

FIG. 8

GAS SUPPLY LINE ARRANGEMENTS

CLAIM OF PRIORITY

This application is a U.S. National Stage Filing under 35 U.S.C. 371 from International Application No. PCT/US2023/020450, filed on Apr. 28, 2023, and published as WO 2023/215199 A1 on Nov. 9, 2023, which claims the benefit of priority to U.S. Provisional Patent Application Ser. No. 63/337,508, filed on May 2, 2022, each of which is incorporated by reference herein in its entirety.

TECHNICAL FIELD

The subject matter disclosed herein generally relates to methods and systems for inhibiting or removing particle contamination in a semiconductor processing chamber, and more particularly to gas supply line arrangements for inhibiting or removing particle contamination during clean and purge cycles of the process chamber.

BACKGROUND

Semiconductor substrate processing systems are used to process semiconductor substrates by techniques including etching, physical vapor deposition (PVD), chemical vapor deposition (CVD), plasma-enhanced chemical vapor deposition (PECVD), pulsed deposition layer (PDL), plasma-enhanced pulsed deposition layer (PEPDL), and resist removal. One type of semiconductor substrate processing apparatus is a plasma processing apparatus that includes a vacuum process chamber containing upper and lower electrodes. The vacuum process chamber is supplied by process gas supply lines. In a substrate processing cycle, a radio frequency (RF) power is applied between the electrodes to excite a process gas into plasma for processing semiconductor substrates in the chamber. In cleaning and purge cycles of the process chamber, particulate material can collect on internal surfaces of the gas supply lines, contaminate a wafer in subsequent processing, and cause leakage of valves, for example.

The background description provided herein is to generally present the context of the disclosure. It should be noted that the information described in this section is presented to provide the skilled artisan some context for the following disclosed subject matter and should not be considered as admitted prior art. More specifically, work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods, systems, and computer programs are presented for inhibiting or removing particle contamination in a semiconductor processing chamber and apparatus. Some examples include gas supply line arrangements for inhibiting particle contamination during clean and purge cycles of the processing chamber.

In some examples, a gas supply line arrangement is provided for inhibiting particle contamination in a substrate process chamber. An example gas supply line arrangement comprises a cleaning gas source for a clean cycle of the substrate process chamber; a purge gas source for a purge cycle of the substrate process chamber; a gas supply line to carry cleaning gas and purge gas towards the substrate process chamber; and a three-port valve comprising: a valve inlet connected to the gas supply line; a first valve outlet in fluid communication with the substrate process chamber, the first valve outlet operable to admit or prevent a passage of cleaning gas to the substrate process chamber; and a second valve outlet connected to a divert line and operable to admit or prevent a passage of particle-containing purge gas to the divert line.

In some examples, the second valve outlet is configured only to be opened when the first valve outlet is closed.

In some examples, the first valve outlet defines an internal cleaning gas termination point when closed.

In some examples, the second valve outlet defines an internal purge gas diversion point when opened.

In some examples, the internal purge gas diversion point is upstream of the internal cleaning gas termination point within a body of the three-port valve.

In some examples, a volume of the body of the three-port valve between the purge gas diversion point and the cleaning gas termination point is purgeable of gas and particulate material during the purge cycle.

In some examples, the three-port valve is directly connected to the substrate process chamber or an inlet manifold thereof.

BRIEF DESCRIPTION OF THE DRAWINGS

Various views of the appended drawings merely illustrate example embodiments of the present disclosure and should not be considered as limiting its scope.

FIG. 8 shows example operations of a method of inhibiting particle contamination during a clean or purge cycle of a semiconductor processing chamber, according to an example.

DETAILED DESCRIPTION

Example methods, systems, and computer programs are directed to methods, systems, and machine-readable storage media for inhibiting or removing particle contamination during process cycles in a semiconductor processing chamber. Some examples include gas supply line arrangements for inhibiting particle contamination during clean and purge cycles of the processing chamber. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

As used herein, the terms "wafer" and "substrate" are used interchangeably. A wafer or substrate indicates a support material upon which, or within which, elements of a semiconductor device are fabricated or attached. A substrate (e.g., substrate 106 in FIG. 1) may include, for example, wafers (e.g., having a diameter of 100 mm, 150 mm, 200 mm, 300 mm, 950 mm, or larger) composed of, for example, elemental-semiconductor materials (e.g., silicon (Si) or germanium (Ge)) or compound-semiconductor materials (e.g., silicon germanium (SiGe) or gallium arsenide (GaAs)). Additionally, other substrates include, for example, dielectric materials such as quartz or sapphire (onto which semiconductor materials may be applied). Example substrates include blanket substrates and patterned substrates. A blanket substrate is a substrate that includes a low-surface (or planar) top surface. A patterned substrate is a substrate that includes a high-surface (or structured) top surface. A structured top surface of a substrate may include different high-surface-area structures such as 3D NAND memory holes or other structures.

Figure 1:
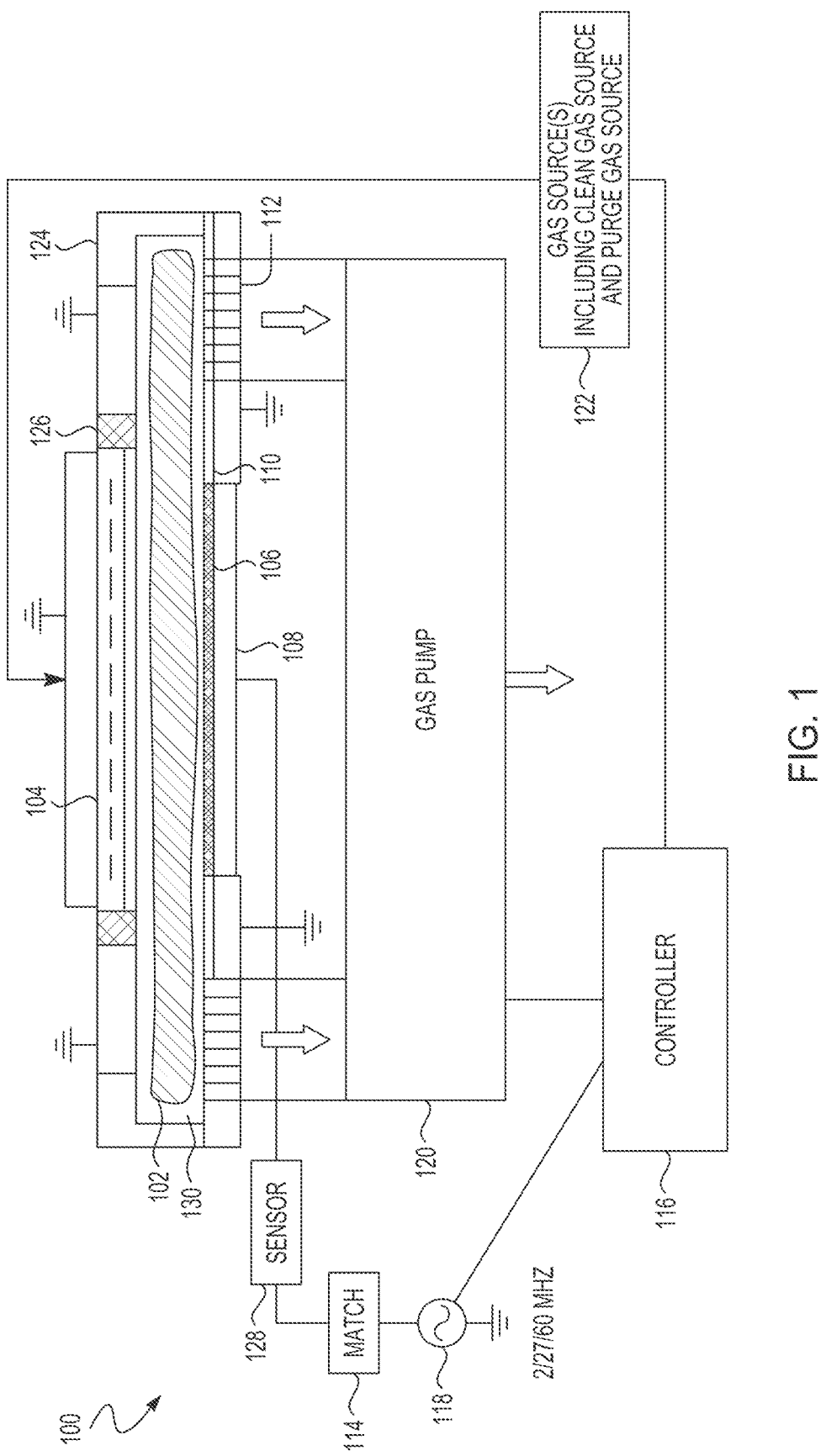
FIG. 1 illustrates a process chamber, such as a deposition chamber, for manufacturing substrates, according to some example embodiments.

A general description of a process chamber using the disclosed methods is provided with reference to FIG. 1. FIG. 1 illustrates a process chamber 100 (e.g., an etching or deposition chamber) for manufacturing substrates, according to one embodiment. In some examples, the process chamber 100 may also be referred to as a vacuum chamber. Exciting an electric field between two electrodes is one of the methods to obtain radio frequency (RF) gas discharge in a process chamber. When an oscillating voltage is applied between the electrodes, the discharge obtained is referred to as a CCP discharge.

Plasma 102 may be created within a processing zone 130 of the process chamber 100, utilizing one or more process gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface and producing volatile molecules, which may be pumped away. When a plasma is created, the positive ions are accelerated from the plasma across a space-charge sheath separating the plasma from chamber walls to strike the substrate surface with enough energy to remove material from the substrate surface. The process of using highly energetic and chemically reactive ions to selectively and anisotropically remove materials from a substrate surface is called Reactive Ion Etch (RIE). In some examples, the process chamber 100 may be used in connection with PECVD or PEALD deposition processes.

A controller 116 manages the operation of the process chamber 100, such as during processing, clean and purge cycles, and by controlling the different elements in the process chamber 100, such as RF generator 118, gas source(s) 122, and gas pump 120. The gas source(s) 122 may include a cleaning gas source and a purge gas source, described further below. In one embodiment, fluorocarbon gases, such as $CF_4$ and $C_4F_8$, are used in a dielectric etch process for their anisotropic and selective etching capabilities; but the principles described herein may be applied to other plasma-creating gases. The fluorocarbon gases are readily dissociated into chemically reactive by-products that include smaller molecular and atomic radicals. These chemically reactive by-products etch away the dielectric material.

The process chamber 100 illustrates a processing chamber with an upper (or top) electrode 104 and a lower (or bottom) electrode 108. The upper electrode 104 may be grounded or coupled to an RF generator (not shown), and the lower electrode 108 is coupled to the RF generator 118 via a matching network 114. The RF generator 118 provides an RF signal between the upper electrode 104 and the lower electrode 108 to generate RF power in one or multiple (e.g., two or three) different RF frequencies. According to the desired configuration of the process chamber 100 for a particular operation, at least one of the multiple RF frequencies may be turned ON or OFF. In the embodiment shown in FIG. 1, the RF generator 118 is configured to provide at least three different frequencies, e.g., 400 kHz, 2 MHz, 27 MHz, and 60 MHz, but other frequencies are also possible.

The process chamber 100 includes a gas showerhead on the upper electrode 104 to input process gas into the process chamber 100 provided by the gas source(s) 122, and a perforated confinement ring 112 that allows the gas to be pumped out of the process chamber 100 by gas pump 120. In some example embodiments, the gas pump 120 is a turbomolecular pump, but other types of gas pumps may be utilized.

When the substrate 106 is present in the process chamber 100, the silicon focus ring 110 is situated next to substrate 106 such that there is a uniform RF field at the bottom surface of the plasma 102 for uniform etching (or deposition) on the surface of the substrate 106. The embodiment of FIG. 1 shows a triode reactor configuration where the upper electrode 104 is surrounded by a ground electrode 124 (e.g., a symmetric RF ground electrode). Insulator 126 is a dielectric that isolates the ground electrode 124 from the upper electrode 104. Other implementations of the process chamber 100, including ICP-based implementations, are also possible without changing the scope of the disclosed embodiments.

Each frequency generated by the RF generator 118 may be selected for a specific purpose in the substrate manufacturing process. In the example of FIG. 1, with RF powers provided at 400 kHz, 2 MHz, 27 MHz, and 60 MHz, the 400 kHz or 2 MHz RF power provides ion energy control, and the 27 MHz and 60 MHz powers provide control of the plasma density and the dissociation patterns of the chemistry. This configuration, where each RF power may be turned ON or OFF, enables certain processes that use ultra-low ion energy on the substrates, and certain processes (e.g., soft etch for low-k materials) where the ion energy has to be low (e.g., under 700 or 200 eV).

In another embodiment, a 60 MHz RF power is used on the upper electrode 104 to get ultra-low energies and very high density. This configuration allows chamber cleaning with high-density plasma when substrate 106 is not in the process chamber 100, while minimizing sputtering on the Electrostatic Chuck Surface (ESC). The ESC surface is exposed when substrate 106 is not present, and any ion energy on the surface should be avoided, which is why the bottom 2 MHz and 27 MHz power supplies may be off during cleaning.

In an example embodiment, the process chamber 100 further includes a sensor 128 which may be placed between the matching network 114 of the RF generator 118 and the lower electrode 108. The sensor 128 may include a voltage-current (or V-I) sensor configured to generate a plurality of signals (e.g., sensed data) that are indicative of at least one signal characteristic of RF signals generated by the RF generator 118 at a corresponding plurality of time instances. For example, the V-I sensor may generate a plurality of signals that are indicative of one or more of the following signal characteristics of RF signals: voltage, current, phase, delivered power, and impedance. In some examples, the plurality of signals generated by the sensor 128 at the corresponding plurality of time instances may be stored (e.g., in on-chip memory of controller 116 or the sensor 128) and later retrieved (e.g., by the controller 116) for subsequent processing. In other aspects, the plurality of signals generated by the sensor 128, at the corresponding plurality of time instances, may be automatically communicated to the controller 116 as they are generated.

In some examples, the gas source(s) 122 are connected to one or more gas line supply arrangements disposed upstream of the gas showerhead on the upper electrode 104. The gas supply line arrangements may include one or more inlet manifolds (not visible in FIG. 1) connected to the process chamber 100. As mentioned above, the gas source(s) 122 may include a cleaning gas source and a purge gas source. In some examples, the gas line supply arrangements are connected to these gas sources and are used for cleaning and purge cycles of the process chamber 100 between or after substrate processing cycles. In this regard, an inlet manifold may carry a plasma gas containing fluorine for chamber cleaning in a "clean cycle". The "clean cycle" is sometimes followed by a "purge cycle" using argon gas to remove aluminum fluoride particles generated during the clean cycle. The aluminon fluoride particulate material can collect on internal surfaces of the gas supply lines, contaminate a wafer in subsequent processing, and cause leakage of ALD valves, for example.

Figure 2:
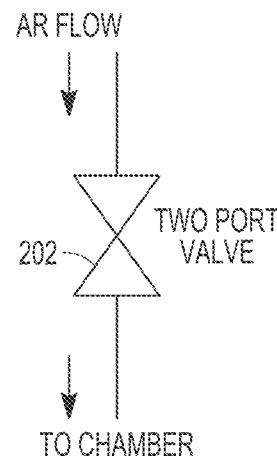
FIGS. 2-3 show aspects of conventional gas supply line arrangements.

In conventional gas line supply arrangements, for example as shown in FIG. 2, a remote plasma generator (for a clean cycle) or gas source (for a purge cycle) can be isolated from the process chamber 100 of FIG. 1, using a two-port valve 202. Here, argon purge gas containing aluminum fluoride particles is exhausted directly to the process chamber 100 and can cause the wafer-contamination problem discussed above. Other processing cycles can be affected by such particulate matter. Examples in this disclosure seeks to inhibit particle contamination in wafer processing, chamber cleaning, and purge cycles, and in some cases provide particle removal and decontamination during or in preparation for such cycles.

Figure 3:
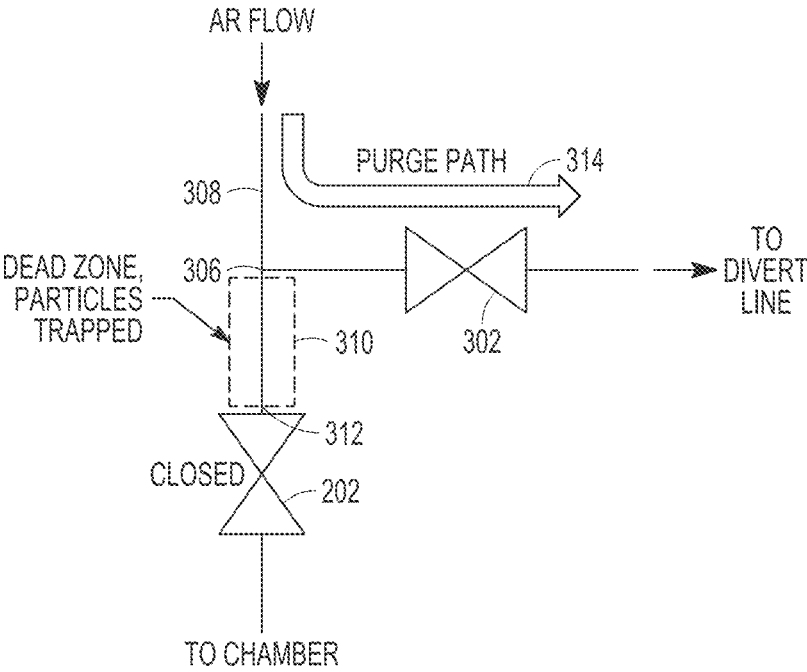

Some further conventional examples seek to divert the argon purge away from the process chamber, for example as shown in FIG. 3. Here, the two-port valve 202 of FIG. 2 can be closed, disallowing particles to flow into the process chamber 100. During a purge cycle, the particle-containing argon gas instead flows in a diverted purge path 314 through another two-port valve 302 into a divert line 304. A gas diversion point 306 lies externally of and upstream of the two-port valves 202 and 302 at a joint or fork in the gas supply line 308, as shown. A gas termination point 312 in the gas supply line 308 lies at the downstream two-port valve 202. This non-coincident arrangement of external gas diversion and termination points can create a dead zone 310 (or volume) between the gas diversion point 306 and the gas termination point 312. The existence of the dead zone 310 does not solve, and in fact can exacerbate, the problem of particle contamination. Particles can still be trapped in the dead zone 310 in FIG. 3 even when a purge cycle is underway. These particles are unable to escape down the divert line 304. The only way out of the dead zone 310 downstream is through the process chamber 100. Thus, when the two-port valve 202 is opened again for subsequent wafer processing or cleaning these trapped particles pass directly into the process chamber 100 leading to the same problems discussed further above. Thus, despite provision of a divert line 304, the contamination issue persists.

In some present examples of this disclosure, these problems are addressed by gas supply line arrangements for a process chamber 100 that include a strategically placed and configured three-port valve. The three-port valve is also known as a three-way valve in some examples.

Figure 4:
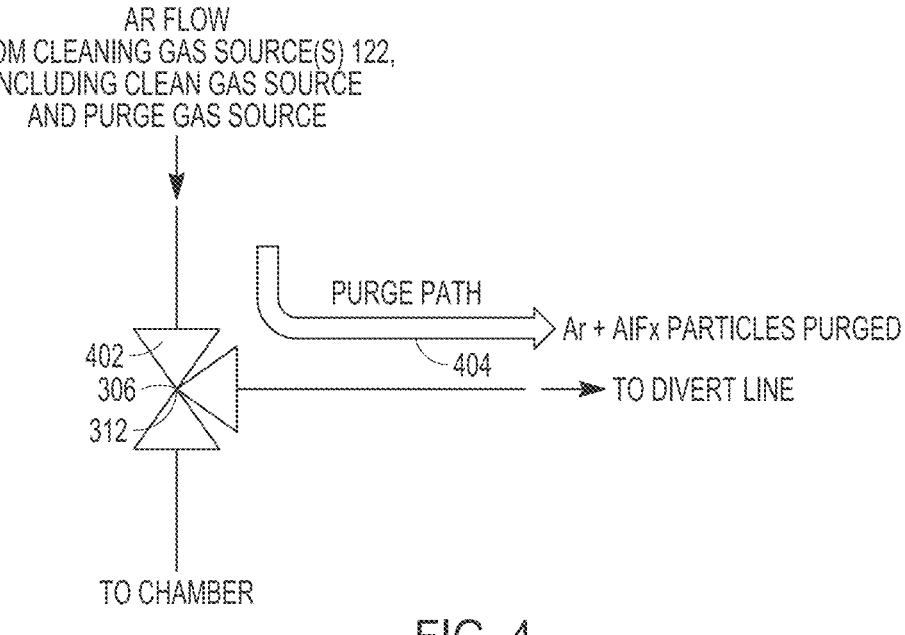
FIG. 4 shows aspects of a gas supply line arrangement, according to an example embodiment of the present disclosure.

With reference to FIG. 4, in some examples a three-port valve 402 is located at the gas diversion point 306 of FIG. 3, or at least at the start of a purge path 404 in a gas supply line arrangement of a process chamber 100. The purge path 404 proceeds through the three-port valve 402 but not through any portion of a downstream line below the three-port valve 402 that might otherwise form a dead zone.

As described more fully below, the gas diversion point 306 and the gas termination point 312 of FIG. 3 are rendered substantially coincident in the three-port valve 402 of FIG. 4. In some examples, the gas diversion point 306 and the gas termination point 312 are rendered substantially coincident within the body of the three-port valve 402. The external dead zone 310 is substantially eliminated or at least minimized, accordingly. In some examples described further below, to the extent a minimized dead zone remains inside the three-port valve 402, this zone nevertheless remains purgeable of particulate material and contamination.

In some examples, the three-port valve 402 is located immediately adjacent a process chamber 100 or inlet manifold thereof such that no dead zone 310 downstream of the three-port valve 402 is formed in a supply line. In other words, the gas supply line 308 terminates at the three-port valve 402 and does not pass beyond it.

Figure 5:
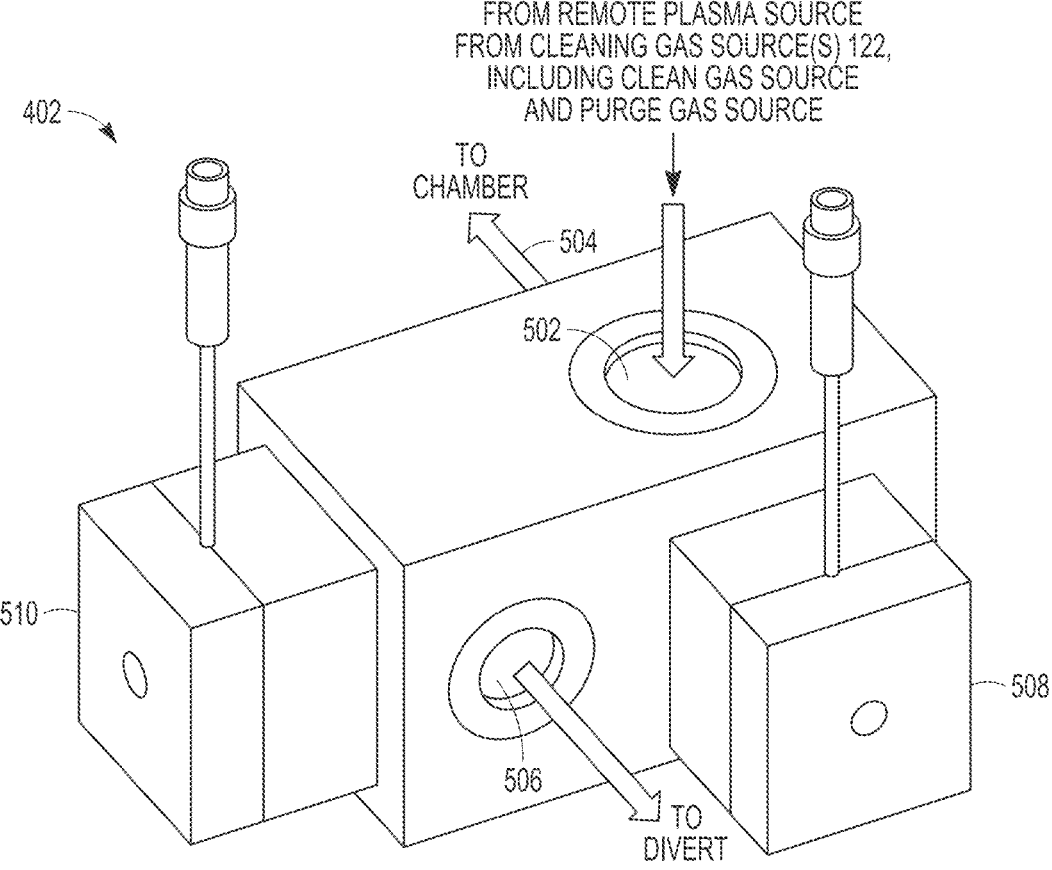
FIG. 5 shows a pictorial schematic outline of a three-port valve, according to an example embodiment.

An example three-port valve 402 is shown in schematic outline in FIG. 5. The three-port valve 402 has a valve inlet 502, a first valve outlet 504, and a second valve outlet 506, hence the name three-port or three-way valve. First and second pneumatically powered valve actuators 508 and 510 operate to open and close the first and second valve outlets 504 and 506, respectively.

Figure 6:
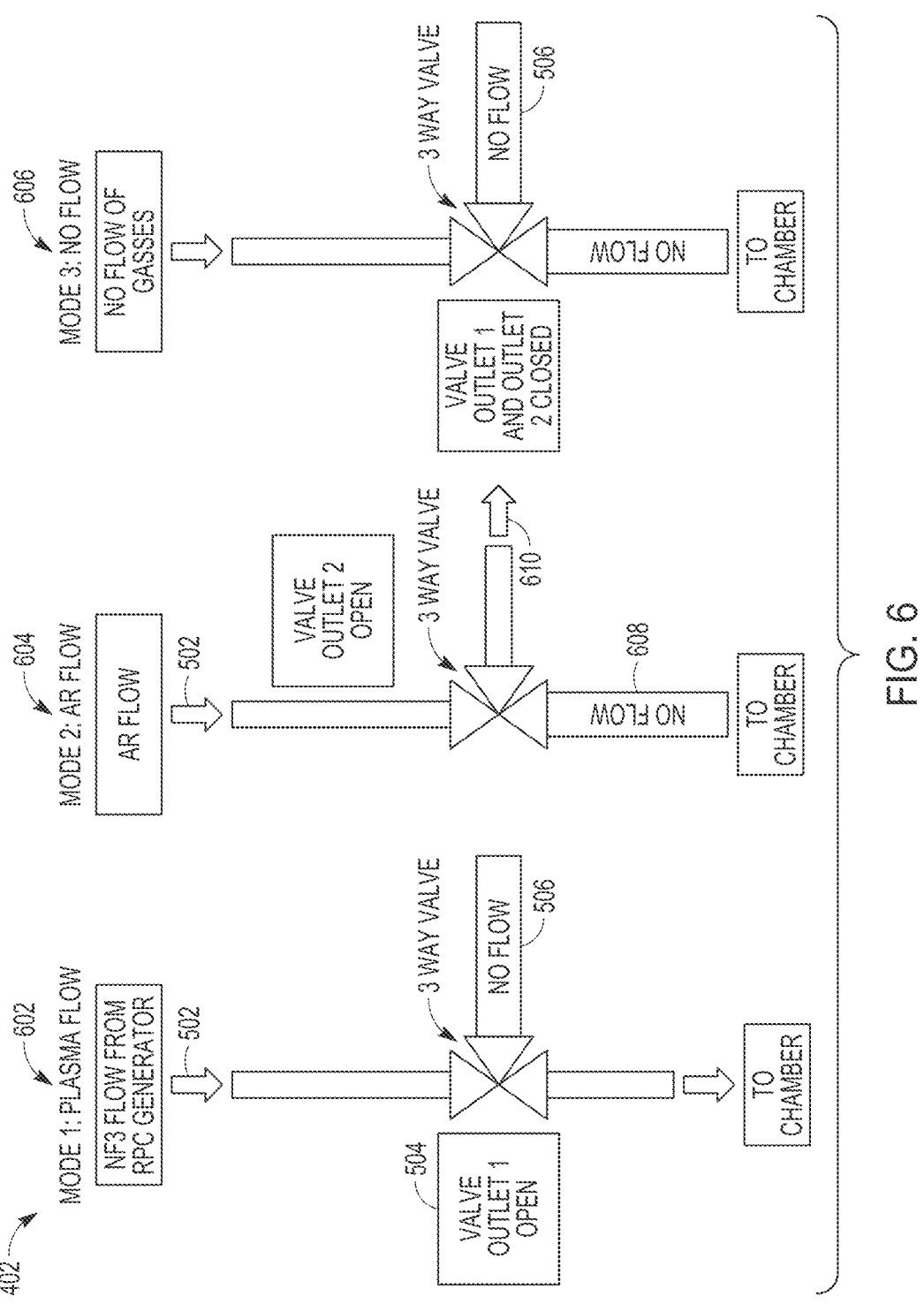
FIG. 6 shows example modes of a three-port valve, according to example embodiments.

FIG. 6 shows example modes of a three-port valve 402. In a first mode 602 (e.g., "plasma flow" mode) of the three-port valve 402, for example, adopted during substrate processing or chamber cleaning gas, such as fluorine, enters the valve inlet 502 of the three-port valve 402. The inlet gas may be provided for example from an upstream gas source from gas source(s) 122 of FIG. 1 or a remote plasma gas generator (RPC generator). The first valve outlet 504 is open and allows passage of the fluorine gas to be admitted into the downstream process chamber 100 for cleaning or substrate processing purposes. The second valve outlet 506 is closed and there is no gas flow through that outlet in the first plasma flow mode. All gas flow is constrained to pass into the process chamber 100. However, the abrasive and corrosive nature of a fluorine gas used in a cleaning cycle can still generate unwanted particles, such as aluminum fluoride particles, that can collect on internal surfaces of gas lines and chamber walls and cause wafer contamination and valve leakage.

Thus, in a second mode 604 (e.g., "purge flow" mode), a purge gas such as argon is used to purge these particles away and inhibit wafer contamination and other damage occurring in the chamber and associated valves and equipment. In an example present arrangement, instead of flushing the trapped dead zone particles into the chamber as in the prior art, the first valve outlet 504 is closed, disallowing entry of gas and particles into the chamber, as shown by "no flow" 608. The second valve outlet 506 is opened and the purged gas and particles exit the valve through that outlet and pass harmlessly at 516 into a divert line at 610. In some examples, the second valve outlet 506 is configured only to be opened when the first valve outlet 504 is closed, so that the risk of allowing particles and contamination into the process chamber 100 of FIG. 1 is reduced, if not eliminated.

In a third mode 606 (e.g., "no flow" mode), there is no flow of gas through the three-port valve 402 as both of the first and second valve outlets 504 and 506 are closed. In this mode, particulate material or contamination can be held temporarily and safely upstream of the three-port valve 402, a divert line 610, or the process chamber 100, as needed.

Figure 7:
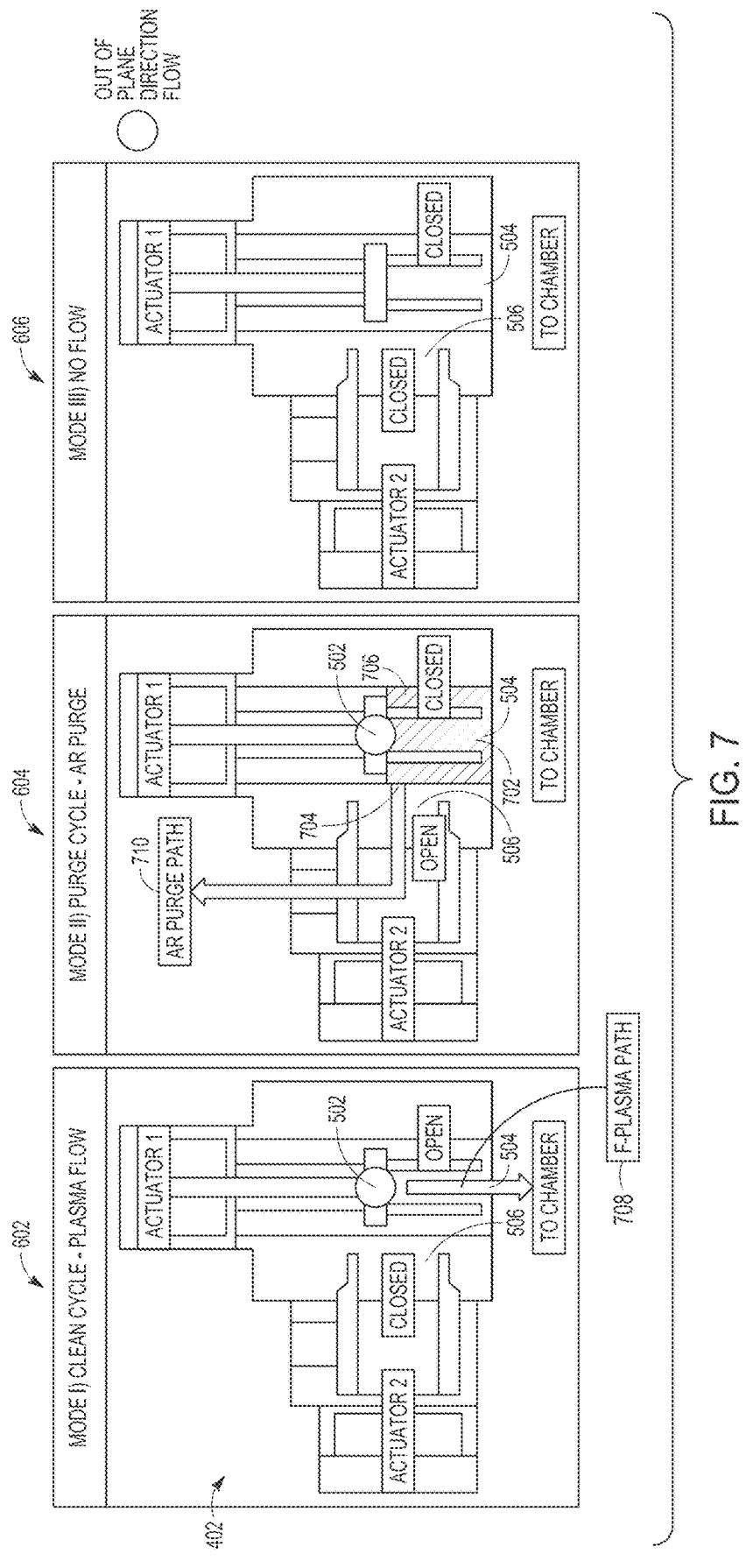
FIG. 7 shows internal configurations of a three-port valve, according to example embodiments.

Internal configurations of an example three-port valve 402 corresponding to the three modes including the first mode 602 (plasma flow), the second mode 604 (purge flow), and the third mode 606 (no flow) can be seen with reference to FIG. 7 of the accompanying drawings.

In modes 1 and 2, a gas such as fluorine or argon (or a mixed gas containing either or different constituents) can be admitted into the three-port valve 402 via the valve inlet 502 in a plane orthogonal to the page. In mode 1 (for example including a clean cycle), the first valve outlet 504 is open and the admitted gas can pass into the chamber 100 for chamber cleaning in a fluorine-plasma path 708. In mode 1, the second valve outlet 506 is connected to a divert (purge) line but is closed, as shown. No gas passes into the divert line in mode 1.

In mode 2 (for example including a purge cycle), argon gas is supplied into the valve inlet 502, again orthogonally into the page. The first valve outlet 504 is closed and defines a gas termination point 702 disposed internally of the three-port valve 402. No purge gas and, perhaps more importantly, no particle contamination carried by the purge gas, is allowed to be admitted to the chamber 100 in mode 2. Instead, the second valve outlet 506 is opened allowing the purge gas and the particle contamination carried therein to pass harmlessly into the connected divert line. The second valve outlet 506 defines a gas diversion point 704.

In the illustrated example, the gas diversion point 704 is disposed slightly upstream of the gas termination point 702, but nevertheless is still provided internally of the three-port valve 402. In the illustrated example, the gas termination point 702 and the gas diversion point 704 are not disposed upstream or downstream in external or separate gas lines, for example as configured in the prior art discussed above. Rather, as in the illustrated example, the gas termination point 702 and gas diversion point 704 are substantially coincident (proximate to each other without an intervening supply line), or at least coincident in the sense that they are both disposed within the body of the same three-port valve 402. The existence of a dead zone is substantially eliminated, or at least eliminated with respect to the external environment of the three-port valve 402 and the surrounding gas supply line arrangement. Of additional note is that to the extent a potential dead zone or volume exists internally of the three-port valve 402 between the gas termination point 702 and the gas diversion point 704, as shown for example by the hatched area marked 706; this zone remains flushable. As purge gas passes through the three-port valve 402 it cleans or sweeps the potential dead zone 706 out and entrains particulate material and other contamination out through the second valve outlet 506 in a purge path 710 as shown.

In mode 3 (no flow), both the first valve outlet 504 and the second valve outlet 506 of the three-port valve 402 are closed. No gas is admitted to the chamber 100 or to the divert line.

Some examples include methods. With reference to FIG. 8, a method 800 of inhibiting particle contamination during a clean or purge cycle of a substrate process chamber comprises: at operation 802, providing a cleaning gas source for a clean cycle of the substrate process chamber; at operation 804, providing a purge gas source for a purge cycle of the substrate process chamber; at operation 806, connecting a gas supply line to carry cleaning gas and purge gas towards the substrate process chamber; at operation 808, connecting a three-port valve into a gas supply line arrangement for the substrate process chamber, the three-port valve comprising a valve inlet connectable to the gas supply line; a first valve outlet in fluid communication with the substrate process chamber, the first valve outlet operable to admit or prevent a passage of the cleaning gas to the substrate process chamber, the three-port valve further comprising a second valve outlet connectable to a divert line and operable to admit or prevent a passage of particle-containing purge gas to the divert line; at operation 810, connecting the three-port valve to the divert line; and, at operation 812, discharging the particle-containing purge gas into the divert line during the purge cycle.

In some examples, the method 800 further comprises opening the second valve outlet only when the first valve outlet is closed.

In some examples, the method 800 further comprises configuring the first valve outlet to define an internal cleaning gas termination point when closed.

In some examples, the method 800 further comprises configuring the second valve outlet to define an internal purge gas diversion point when opened.

In some examples, the method 800 further comprises configuring or operating the three-port valve such that the internal purge gas diversion point is upstream of the internal cleaning gas termination point within a body of the three-port valve.

In some examples, the method 800 further comprises purging a volume of the body of the three-port valve between the internal purge gas diversion point and the internal cleaning gas termination point of gas and particulate material during the purge cycle.

In some examples, the method 800 further comprises connecting the three-port valve directly connected to the substrate process chamber or an inlet manifold thereof.

Some examples provide a non-transitory machine-readable medium including instructions which, when read by a machine, cause the machine to perform operations in a method of inhibiting particle contamination during a clean or purge cycle of a substrate process chamber, the method comprising: opening or closing a cleaning gas source for a clean cycle of the process chamber; opening or closing a purge gas source for a purge cycle of the process chamber; controlling a connected gas supply line carrying cleaning gas and purge gas towards the substrate process chamber; controlling actuators of a three-port valve connected to the gas supply line, the three-port valve comprising: a valve inlet in fluid communication with the gas supply line; a first valve outlet in fluid communication with the substrate process chamber, the first valve outlet operable to admit or prevent a passage of the cleaning gas to the substrate process chamber, the three-port valve further comprising a second valve outlet connectable to a divert line and operable to admit or prevent a passage of particle-containing purge gas to the divert line; and sending a signal to one of the actuators of the three-port valve to open the second valve outlet to discharge the particle-containing purge gas into the divert line during the purge cycle.

Figure 9:
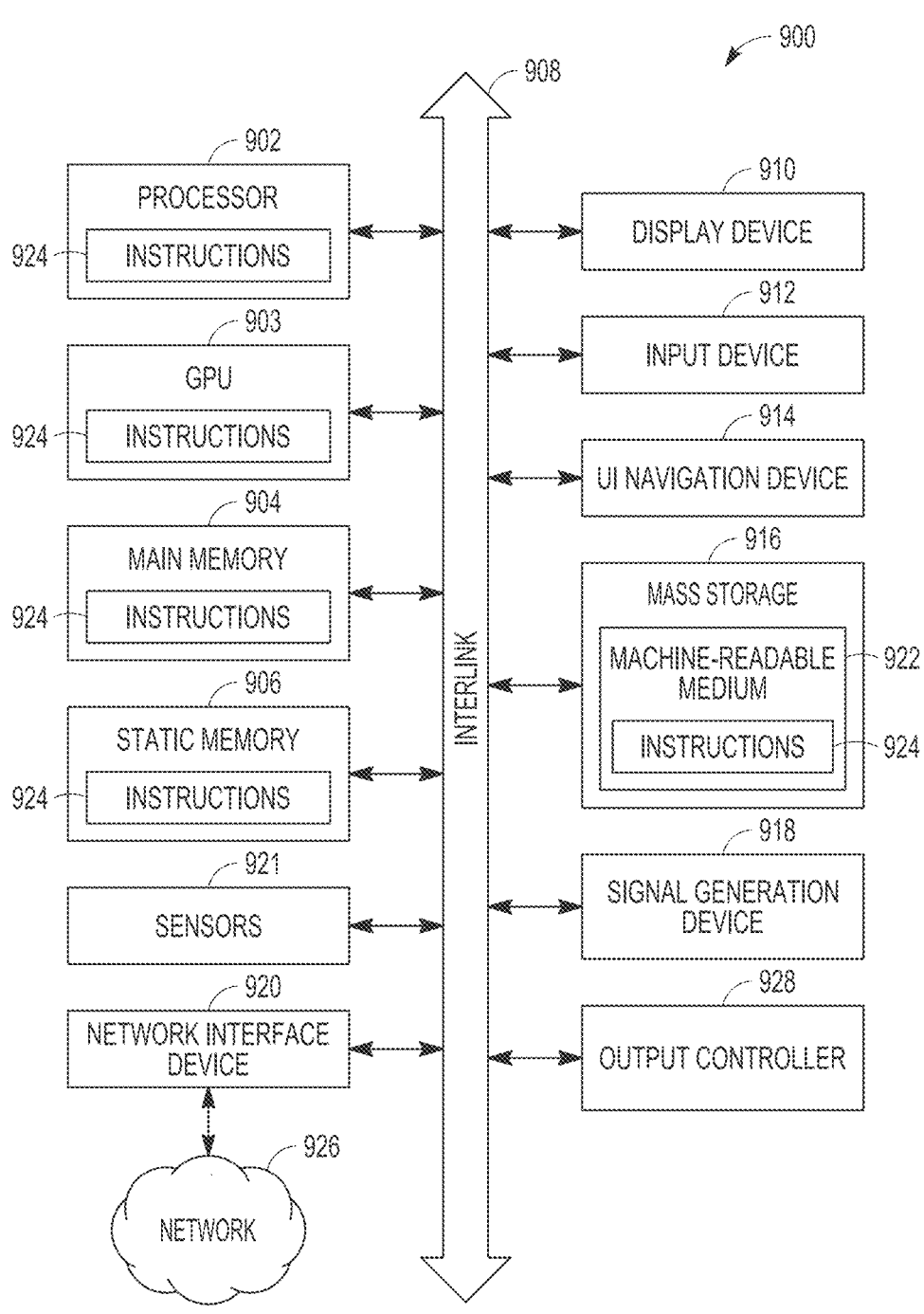
FIG. 9 is a block diagram illustrating an example of a machine upon which one or more example method embodiments may be implemented, or by which one or more example embodiments may be controlled.

FIG. 9 is a block diagram illustrating an example of a machine 900 (such as the controller 116 of FIG. 1) upon or by which one or more example process embodiments described herein may be implemented or controlled. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in a peer-to-peer (P2P) (or other distributed) network environment. Further, while only a single machine 900 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, several components, or mechanisms. Circuitry is a collection of circuits implemented in tangible entities that include hardware (e.g., simple circuits, gates, logic). Circuitry membership may be flexible over time and underlying hardware variability. Circuitries include members that may, alone or in combination, perform specified operations when in use. In one example, the hardware of the circuitry may be immutably designed to carry out a specific operation (e.g., hardwired). In another example, the hardware of the circuitry may include variably connected physical components, (e.g., execution units, transistors, simple circuits) including a computer-readable medium physically modified (e.g., magnetically and electrically by the moveable placement of invariant massed particles) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In some examples, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 900 may include a hardware processor 902 (e.g., a central processing unit (CPU), a hardware processor core, or any combination thereof), a graphics processing unit (GPU) 903, a main memory 904, and a static memory 906, some or all of which may communicate with each other via an interlink (e.g., bus) 908. The machine 900 may further include a display device 910, an alphanumeric input device 912 (e.g., a keyboard), and a user interface (UI) navigation device 914 (e.g., a mouse). In an example, the display device 910, alphanumeric input device 912, and UI navigation device 914 may be a touch screen display. The machine 900 may additionally include a mass storage device (e.g., drive unit) 916, a signal generation device 918 (e.g., a speaker), a network interface device 920, and one or more sensors 921, such as a Global Positioning System (GPS) sensor, compass, accelerometer, or another sensor. The machine 900 may include an output controller 928, such as a serial (e.g., Universal Serial Bus (USB)), parallel, or other wired or wireless (e.g., Infrared (IR), Near Field Communication (NFC)) connection to communicate with or control one or more peripheral devices (e.g., a printer, card reader).

In an example embodiment, the hardware processor 902 may perform the functionalities of the controller 116 discussed herein.

The mass storage device 916 may include a machine-readable medium 922 on which is stored one or more sets of data structures or instructions 924 (e.g., software) embodying or utilized by any one or more of the techniques or functions described herein. The instructions 924 may also reside, completely or at least partially, within the main memory 904, within the static memory 906, within the hardware processor 902, or within the GPU 903 during execution thereof by the machine 900. In an example, one or any combination of the hardware processor 902, the GPU 903, the main memory 904, the static memory 906, or the mass storage device 916 may constitute machine-readable media.

While the machine-readable medium 922 is illustrated as a single medium, the term "machine-readable medium" may include a single medium or multiple media, (e.g., a centralized or distributed database, and/or associated caches and servers) configured to store the one or more instructions 924.

The term "machine-readable medium" may include any medium that is capable of storing, encoding, or carrying instructions 924 for execution by the machine 900 and that cause the machine 900 to perform any one or more of the techniques of the present disclosure, or that is capable of storing, encoding, or carrying data structures used by or associated with such instructions 924. Non-limiting machine-readable medium examples may include solid-state memories and optical and magnetic media. In an example, a massed machine-readable medium comprises a machine-readable medium 922 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 924 may further be transmitted or received over a communications network 926 using a transmission medium via the network interface device 920.

Implementation of the preceding techniques may be accomplished through any number of specifications, configurations, or example deployments of hardware and software. It should be understood that the functional units or capabilities described in this specification may have been referred to or labeled as components or modules in order to emphasize their implementation independence more particularly. Such components may be embodied by any number of software or hardware forms. For example, a component or module may be implemented as a hardware circuit comprising custom, very-large-scale integration (VLSI) circuits, or gate arrays, off-the-shelf semiconductors such as logic chips, transistors, or other discrete components. A component or module may also be implemented in programmable hardware devices such as field-programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center) than that in which the code is deployed (e.g., in a computer embedded in a sensor or robot). Similarly, operational data may be identified and illustrated herein within components or modules and may be embodied in any suitable form and organized within any suitable type of data structure. The operational data may be collected as a single data set or may be distributed over different locations including over different storage devices, and may exist, at least partially, merely as electronic signals on a system or network. The components or modules may be passive or active, including agents operable to perform desired functions.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components for example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

The claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within the scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A gas supply line arrangement for inhibiting particle contamination in a substrate process chamber, the gas supply line arrangement comprising:
    a cleaning gas source for a clean cycle of the substrate process chamber;
    a purge gas source for a purge cycle of the substrate process chamber;
    a gas supply line to carry cleaning gas and purge gas towards the substrate process chamber; and
    a three-port valve comprising:
        a valve inlet connected to the gas supply line;
        a first valve outlet in fluid communication with the substrate process chamber, the first valve outlet operable to admit or prevent a passage of cleaning gas to the substrate process chamber; and
        a second valve outlet connected to a divert line and operable to admit or prevent a passage of particle-containing purge gas to the divert line.

2. The gas supply line arrangement of claim 1, wherein the second valve outlet is configured only to be opened when the first valve outlet is closed.

3. The gas supply line arrangement of claim 1, wherein the first valve outlet defines an internal cleaning gas termination point when closed.

4. The gas supply line arrangement of claim 3, wherein the second valve outlet defines an internal purge gas diversion point when opened.

5. The gas supply line arrangement of claim 4, wherein the internal purge gas diversion point is upstream of the internal cleaning gas termination point within a body of the three-port valve.

6. The gas supply line arrangement of claim 5, wherein a volume of the body of the three-port valve between the purge gas diversion point and the cleaning gas termination point is purgeable of gas and particulate material during the purge cycle.

7. The gas supply line arrangement of claim 1, wherein the three-port valve is directly connected to the substrate process chamber or an inlet manifold thereof.

8. A method of inhibiting particle contamination during a clean or purge cycle of a substrate process chamber, the method comprising:
    providing a cleaning gas source for a clean cycle of the substrate process chamber;
    providing a purge gas source for a purge cycle of the substrate process chamber;
    connecting a gas supply line to carry cleaning gas and purge gas towards the substrate process chamber; and
    connecting a three-port valve into a gas supply line arrangement for the substrate process chamber, the three-port valve comprising a valve inlet connectable to the gas supply line; a first valve outlet in fluid communication with the substrate process chamber, the first valve outlet operable to admit or prevent a passage of the cleaning gas to the substrate process chamber, the three-port valve further comprising a second valve outlet connectable to a divert line and operable to admit or prevent a passage of particle-containing purge gas to the divert line;

connecting the three-port valve to the divert line; and discharging the particle-containing purge gas into the divert line during the purge cycle.

9. The method of claim 8, further comprising opening the second valve outlet only when the first valve outlet is closed.

10. The method of claim 8, further comprising configuring the first valve outlet to define an internal cleaning gas termination point when closed.

11. The method of claim 10, further comprising configuring the second valve outlet to define an internal purge gas diversion point when opened.

12. The method of claim 11, further comprising configuring or operating the three-port valve such that the internal purge gas diversion point is upstream of the internal cleaning gas termination point within a body of the three-port valve.

13. The method of claim 12, further comprising purging a volume of the body of the three-port valve between the internal purge gas diversion point and the internal cleaning gas termination point of gas and particulate material during the purge cycle.

14. The method of claim 8, further comprising connecting the three-port valve directly connected to the substrate process chamber or an inlet manifold thereof.

15. A tangible machine-readable medium including instructions which, when read by a machine, cause the machine to perform operations in a method of inhibiting particle contamination during a clean or purge cycle of a substrate process chamber, the method comprising:

opening or closing a cleaning gas source for a clean cycle of the process chamber;

opening or closing a purge gas source for a purge cycle of the process chamber;

controlling a connected gas supply line carrying cleaning gas and purge gas towards the substrate process chamber;

controlling actuators of a three-port valve connected to the gas supply line, the three-port valve comprising:

a valve inlet in fluid communication with the gas supply line;

a first valve outlet in fluid communication with the substrate process chamber, the first valve outlet operable to admit or prevent a passage of the cleaning gas to the substrate process chamber, the three-port valve further comprising a second valve outlet connectable to a divert line and operable to admit or prevent a passage of particle-containing purge gas to the divert line; and sending a signal to one of the actuators of the three-port valve to open the second valve outlet to discharge the particle-containing purge gas into the divert line during the purge cycle.

\* \* \* \* \*